(12) United States Patent
Oh et al.

(10) Patent No.: US 12,015,101 B2
(45) Date of Patent: Jun. 18, 2024

(54) CHIP SCALE LIGHT-EMITTING DIODE PACKAGE AND MANUFACTURING METHOD THEREOF

(71) Applicant: LUMENS CO., LTD., Yongin-si (KR)

(72) Inventors: Seunghyun Oh, Yongin-si (KR); Pyoynggug Kim, Yongin-si (KR); Sungsik Jo, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 400 days.

(21) Appl. No.: 17/450,181

(22) Filed: Oct. 7, 2021

(65) Prior Publication Data

US 2022/0115557 A1 Apr. 14, 2022

(30) Foreign Application Priority Data

Oct. 13, 2020 (KR) ........................ 10-2020-0131677

(51) Int. Cl.
*H01L 33/00* (2010.01)
*B29D 11/00* (2006.01)
*H01L 33/60* (2010.01)

(52) U.S. Cl.
CPC .... *H01L 33/0095* (2013.01); *B29D 11/00432* (2013.01); *B29D 11/00519* (2013.01);
(Continued)

(58) Field of Classification Search
CPC ................. H01L 33/0095; H01L 33/60; H01L 2933/0041; H01L 2933/0058; H01L 33/507; H01L 33/54; H01L 33/56; H01L 33/58; H01L 33/005; H01L 2933/0016; H01L 2933/0033; B29D 11/00432; B29D 11/00519; B29D 11/00307; B29D 11/00807

See application file for complete search history.

(56) References Cited

U.S. PATENT DOCUMENTS

2006/0187379 A1* 8/2006 Yamanaka ........ G02F 1/133526
349/5
2008/0111141 A1* 5/2008 Li .......................... H01L 33/54
257/E33.059

(Continued)

FOREIGN PATENT DOCUMENTS

KR 20120012677 A * 12/2012

*Primary Examiner* — Bitew A Dinke
(74) *Attorney, Agent, or Firm* — Mei & Mark LLP

(57) ABSTRACT

A method of manufacturing a chip scale light-emitting diode package is provided. The method of manufacturing chip scale light-emitting diode package includes: manufacturing a lens molding sheet including intaglios on one surface thereof; forming a lens layer having lens portions on one surface thereof and a flat surface on a surface opposite thereto by applying a light-transmitting resin to the intaglios; forming an adhesive layer on the flat surface of the lens layer; arranging light-emitting diode chips, each having a first surface and a second surface opposite to the first surface, on the adhesive layer in such a way that the light-emitting diode chips correspond to the lens portions and the second surface is attached to the adhesive layer, wherein a first electrode pad and a second electrode pad are formed on the first surface; and manufacturing a chip array sheet by forming a molding part on the adhesive layer to cover outer surfaces of the light-emitting diode chips.

9 Claims, 10 Drawing Sheets

(52) U.S. Cl.
CPC ...... *H01L 33/60* (2013.01); *H01L 2933/0041* (2013.01); *H01L 2933/0058* (2013.01)

(56) References Cited

U.S. PATENT DOCUMENTS

| | | | |
|---|---|---|---|
| 2011/0146889 A1* | 6/2011 | Hwang | B32B 37/025 156/247 |
| 2012/0112220 A1* | 5/2012 | West | H01L 33/62 257/E33.072 |
| 2014/0246648 A1* | 9/2014 | Im | H01L 33/382 257/13 |
| 2014/0306261 A1* | 10/2014 | Im | H01L 33/62 257/99 |
| 2015/0144918 A1* | 5/2015 | Cho | B29D 11/00788 257/40 |
| 2015/0243853 A1* | 8/2015 | Cha | H01L 33/0093 438/26 |
| 2015/0348906 A1* | 12/2015 | Park | H01L 23/49827 257/774 |
| 2016/0077249 A1* | 3/2016 | Shim | G02B 5/0247 257/40 |
| 2020/0157392 A1* | 5/2020 | Fujikawa | C09J 7/20 |
| 2022/0229209 A1* | 7/2022 | Guo | G02B 3/0031 |

* cited by examiner (a)

(b)

CHIP SCALE LIGHT-EMITTING DIODE PACKAGE AND MANUFACTURING METHOD THEREOF

CROSS-REFERENCE TO RELATED APPLICATION

This application is based on and claims priority under 35 USC § 119 to Korean Patent Application No. 10-2020-0131677, filed on Oct. 13, 2020, in the Korean Intellectual Property Office, the disclosure of which is incorporated by reference herein in its entirety.

BACKGROUND

1. Field

One or more embodiments relate to a chip scale light-emitting diode package and a manufacturing method thereof, and more particularly, to a lens-integrated chip scale light-emitting diode package and a manufacturing method thereof.

2. Description of the Related Art

A lens-integrated light-emitting diode package in which a lens having a predetermined light directing characteristic is disposed on a light-emitting diode chip is used for a backlight unit (BLU) or for lighting. The lens-integrated light-emitting diode package includes a light-emitting diode chip, a package body having a cavity for accommodating the light-emitting diode chip and lead frames connected to the light-emitting diode chip, and a lens integrally formed on an upper surface of the package body.

In most lens-integrated light-emitting diode packages, the package body having the cavity is manufactured, the light-emitting diode chip is accommodated in the cavity, and then a light-transmitting resin is dispensed in a central area of the upper surface of the package body to form the lens. However, such a lens-integrated light-emitting diode package has disadvantages in that a manufacturing process is complicated, a manufacturing cost is high, and it is difficult to maintain the lens in a uniform dome shape, so that the light directing characteristic is not uniform. In addition, in order to implement a dome-shaped lens over a certain thickness, a bottom area of the lens must be increased, which causes a problem in that the package becomes larger than necessary. By forming a dam on the upper surface of the package body, the dam may limit the spread of a resin forming the lens to some extent, but it does not sufficiently suppress the spread of the resin. In other words, in the conventional lens-integrated light-emitting diode package, a dam structure had to be provided to keep the thickness of the lens constant, and it was necessary to have a diameter that is four times the height of the lens to realize a lens with a constant thickness, thereby being difficult to reduce the size of the package. In particular, it was difficult to form a small lens with a micro unit size in the conventional lens-integrated light-emitting diode package.

On the other hand, a chip scale light-emitting diode package has a structure in which electrode pads of the light-emitting diode chip are exposed downwards, in which the side and top surfaces thereof are covered by an encapsulant and/or a white wall, so that compared with the conventional light-emitting diode package, the chip scale light-emitting diode package may be implemented in a much smaller size (e.g., micrometer unit size). However, such a chip scale light-emitting diode package has a problem in that it is difficult to form a lens capable of changing the light directing characteristic.

SUMMARY

One or more embodiments include a chip scale light-emitting diode package having a chip scale package structure in which electrode pads provided in a light-emitting diode chip are exposed to an outside and a lens of a precise shape matching a center of the light-emitting diode chip.

Additional aspects will be set forth in part in the description which follows and, in part, will be apparent from the description, or may be learned by practice of the presented embodiments of the disclosure.

According to one or more embodiments, a chip scale light-emitting diode package manufacturing method includes: manufacturing a lens molding sheet including intaglios; forming a lens layer having lens portions on one surface and a flat surface on the opposite surface by applying a light-transmitting resin to the intaglios; forming an adhesive layer on the flat surface of the lens layer; arranging light-emitting diode chips, each having a first surface and a second surface opposite to the first surface, on the adhesive layer in such a way that the light-emitting diode chips correspond to the lens portions and the second surface is attached to the adhesive layer, wherein a first electrode pad and a second electrode pad are formed on the first surface; and manufacturing a chip array sheet by forming a molding part on the adhesive layer to cover outer surfaces of the light-emitting diode chips.

In an embodiment, in manufacturing the lens molding sheet, an imprinting material layer is formed on a base film, and the imprinting material layer is pressed by a mold having projections corresponding to the intaglios to form the intaglio.

In an embodiment, the adhesive layer is formed by an adhesive film having adhesiveness on one surface in contact with the flat surface of the lens layer and other surface in contact with the light-emitting diode chips.

In an embodiment, the adhesive layer may include a first adhesive film attached to the lens layer and a second adhesive film attached to the light-emitting diode chip, and a wavelength conversion material is disposed between the first adhesive film and the second adhesive film.

In an embodiment, the manufacturing method may further include separating the chip array sheet from the lens molding sheet, and cutting the chip array sheet separated from the lens molding sheet into a plurality of chip scale light-emitting diode packages.

In an embodiment, the manufacturing method may further include forming a plurality of chip scale light-emitting diode packages by cutting only the chip array sheet while the chip array sheet is positioned on the lens molding sheet, and transferring the plurality of chip scale light-emitting diode package onto a support film or substrate after the lens molding sheet holding the plurality of chip scale light-emitting diode packages is inverted by 180 degrees.

In an embodiment, in manufacturing the chip array sheet, the first electrode pad and the second electrode pad of the light-emitting diode chips are exposed to the outside through the molding part.

In an embodiment, each of the light-emitting diode chip may include a first reflective layer and a second reflective layer respectively constituting top and bottom ends thereof.

In an embodiment, the molding part may include a light-transmitting material.

In an embodiment, the molding part may include a reflective material.

According to one or more embodiments, a chip scale light-emitting diode package includes: a light-emitting diode chip having a first electrode pad and a second electrode pad formed on a lower surface; a molding part formed to cover an outer surface of the light-emitting diode chip; an adhesive layer formed to cover an upper surface of the light-emitting diode chip and an upper surface of the molding part; and a lens attached to the adhesive layer and covering the upper surface of the light-emitting diode chip and the upper surface of the molding part, wherein the lens includes a lens portion having a central axis coincident with a central axis of the light-emitting diode chip.

In an embodiment, the adhesive layer includes an adhesive film including an adhesive material on both sides.

In an embodiment, the adhesive layer includes a first adhesive film attached to the lens and a second adhesive film attached to the light-emitting diode chip, and wavelength conversion material is disposed between the first adhesive film and the second adhesive film.

In an embodiment, the molding part may include a light-transmitting material.

In an embodiment, the light-emitting diode chip includes a semiconductor layer stacked structure, a first reflective layer and a second reflective layer, wherein the semiconductor layer stacked structure includes an active layer, a first semiconductor layer formed above the active layer and a second semiconductor layer formed under the active layer, wherein the first reflective layer is formed on the opposite side of the active layer with respect to the first semiconductor layer, and wherein the second reflective layer is formed on the opposite side of the active layer with respect to the second semiconductor layer.

In an embodiment, the light-emitting diode chip include a light-transmitting material layer positioned above the first semiconductor layer and having a light scattering pattern.

In an embodiment, the molding part may include a light reflective material, and the light-emitting diode chip emits light upward.

In an embodiment, the lens portion has a dome shape.

In an embodiment, a distance from a bottom end of the light-emitting diode chip to a top end of the lens is 5 times to 10 times the thickness of the light-emitting diode chip.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
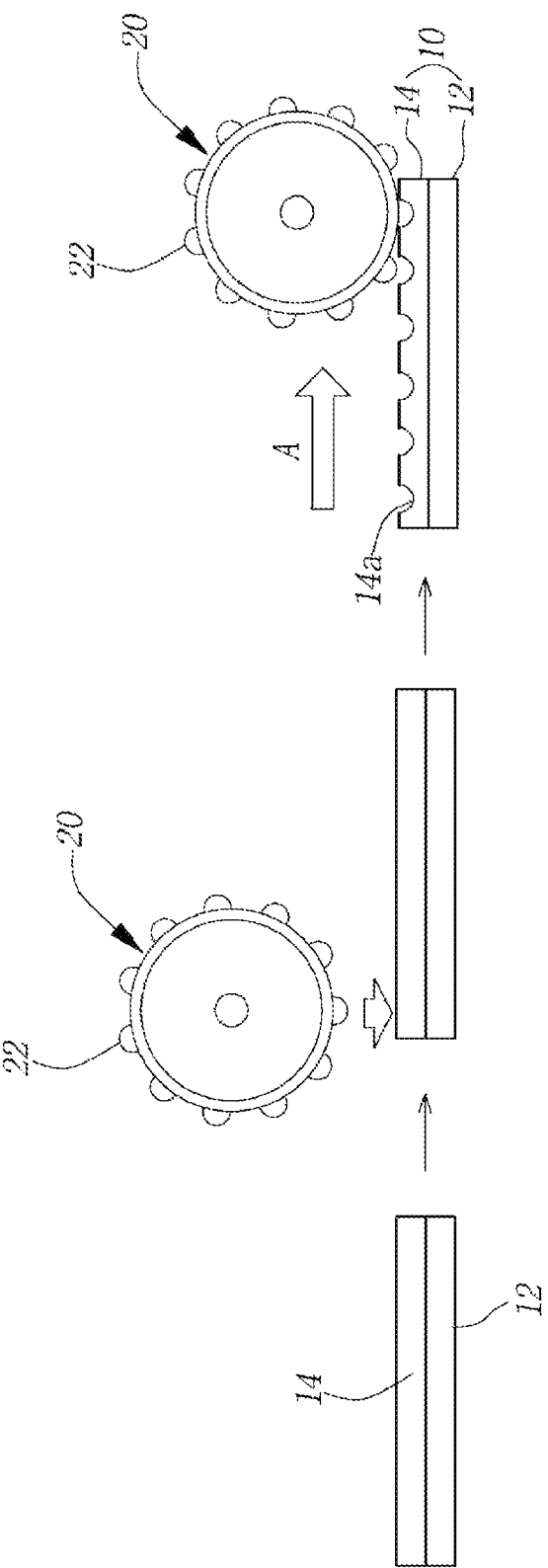
FIG. 1 is a view for explaining manufacturing a lens molding sheet of a chip scale light-emitting diode package manufacturing method according to an embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

A chip scale light-emitting diode package and a manufacturing method thereof according to an embodiment of the present disclosure will be described with reference to FIGS. 1 to 7.

FIG. 1 illustrates manufacturing a lens molding sheet. A lens molding sheet 10 is manufactured to include a plurality of intaglios 14a (hereinafter, referred to as dome-shaped intaglios) corresponding to a dome shape in a matrix arrangement on one surface. In order to manufacture the lens molding sheet 10, first, an imprinting material layer 14 is formed by coating or depositing an imprinting material on a base film 12 made of polyethylene terephthalate (PET) material. At this time, the imprinting material layer 14 has a property of being deformable by a predetermined external force. Next, a plurality of dome-shaped intaglios 14a are formed in a matrix arrangement on the imprinting material layer 14 by using a mold roller 20 having dome-shaped projections 22 formed on an outer circumferential surface. In the present embodiment, the mold roller 20 rotates on the imprinting material layer 14 and moves along an arrow direction A, and presses the imprinting material layer 14 with dome-shaped projections 22 provided on the outer circumferential surface of the mold roller 20 to form the plurality of dome-shaped intaglios 14a on the imprinting material layer 14. Accordingly, the lens molding sheet 10 in which the plurality of dome-shaped intaglios 14a corresponding to the dome shape are formed in a matrix arrangement on one surface may be manufactured.

Figure 2:
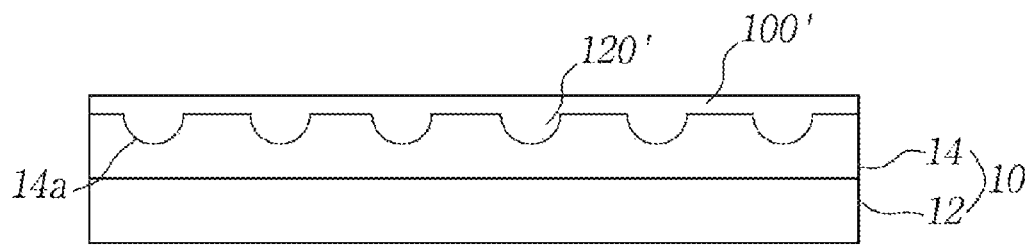
FIG. 2 is a view for explaining forming a lens layer of a chip scale light-emitting diode package manufacturing method according to an embodiment of the present disclosure.

FIG. 2 is a view for explaining forming a lens layer of a chip scale light-emitting diode package manufacturing method according to an embodiment of the present disclosure. Referring to FIG. 2, a light-transmitting resin such as silicon resin is applied to one surface of the lens molding sheet 10 to fill the dome-shaped intaglio 14a. An upper surface of the light-transmitting resin filling the dome-shaped intaglio 14a is flattened. Accordingly, a lens layer 100' having a plurality of dome-shaped lens portions 120' in a matrix arrangement on one side in contact with the lens molding sheet 10 on which the dome-shaped intaglio 14a is formed and a flat surface on the opposite side is formed.

Figure 3:
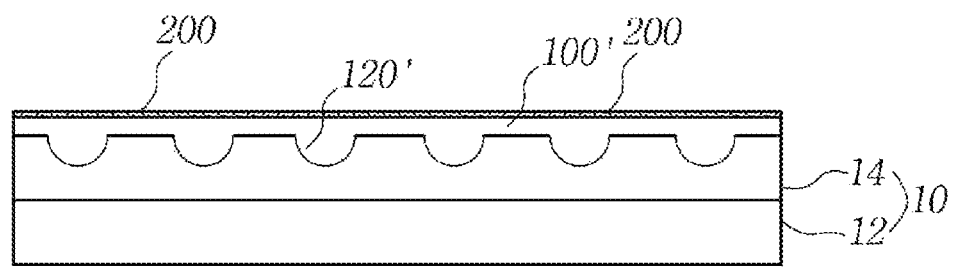
FIG. 3 is a view for explaining forming an adhesive layer of a chip scale light-emitting diode package manufacturing method according to an embodiment of the present disclosure.

FIG. 3 is a view for explaining forming an adhesive layer of a chip scale light-emitting diode package manufacturing method according to an embodiment of the present disclosure.

Referring to FIG. 3, after the lens layer 100' is completely hardened, one double-sided adhesive film including an adhesive material on both sides is attached on the flat surface of the lens layer 100' to form an adhesive layer 200. Alternatively, it may be considered to form an adhesive layer in which a fluorescent material is disposed between two adhesive films including the adhesive material on both sides on the flat surface of the lens layer 100'. One side of the adhesive layer 200 has adhesiveness to the flat surface of the lens layer 100', and the other side of the adhesive layer 200 has adhesiveness to a light-emitting diode chip 300 (refer to FIG. 4) and a molding part 400 (refer to FIG. 5) to be described later.

Figure 4:
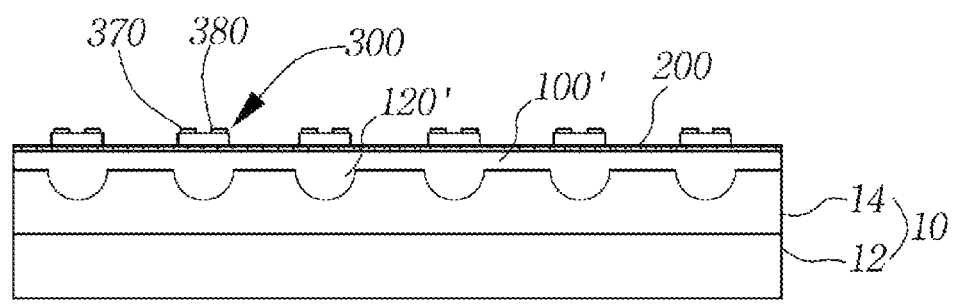
FIG. 4 is a view for explaining arranging a light-emitting diode chip of a chip scale light-emitting diode package manufacturing method according to an embodiment of the present disclosure.

FIG. 4 is a view for explaining arranging a light-emitting diode chip of a chip scale light-emitting diode package manufacturing method according to an embodiment of the present disclosure. Referring to FIG. 4, a plurality of light-emitting diode chips 300 are arranged in a matrix and attached to the adhesive layer 200 attached to the flat surface of the lens layer 100'. At this time, the plurality of light-emitting diode chips 300 are arranged so that central axes of the plurality of light-emitting diode chips 300 coincide with the central axes of the plurality of lens portions 120', respectively. Each of the plurality of light-emitting diode chips 300 has a flip-chip structure including a first surface having a first electrode pad 380 and a second electrode pad 370 and a second surface in direct contact with the adhesive layer 200 on the opposite side.

Figure 5:
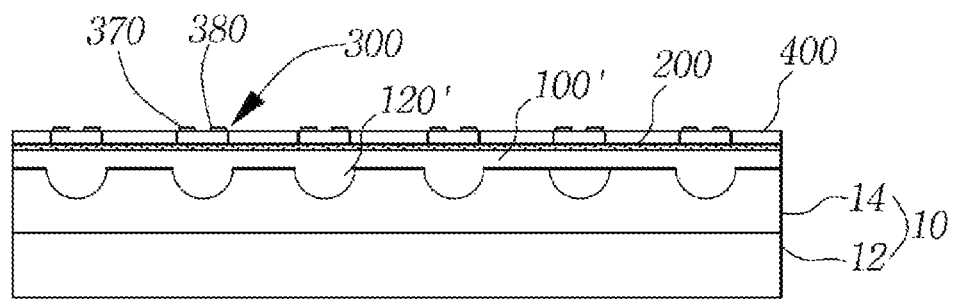
FIG. 5 is a view for explaining forming a molding part of a chip scale light-emitting diode package manufacturing method according to an embodiment of the present disclosure.

FIG. 5 is a view for explaining forming a molding part of a chip scale light-emitting diode package manufacturing method according to an embodiment of the present disclosure.

Referring to FIG. 5, as a light-transmitting resin, preferably a transparent silicon resin, is applied on the adhesive layer 200 to cover the periphery of the light-emitting diode chips 300 and then hardened, a light-transmitting molding part 400 covering the periphery of the light-emitting diode chips 300 is formed. The outer surfaces of the light-emitting diode chips 300 are all covered by the molding part 400. The first electrode pad 380 and the second electrode pad 370 provided on one surface of the light-emitting diode chips 300 are exposed to the outside. By the above-described steps, a chip array sheet 1' (refer to FIG. 6) including the light-emitting diode chips 300 arrayed on the lens layer 100' and the molding part 400 having light-transmitting properties around the light-emitting diode chips 300 is obtained on the lens molding sheet 10.

Figure 6:
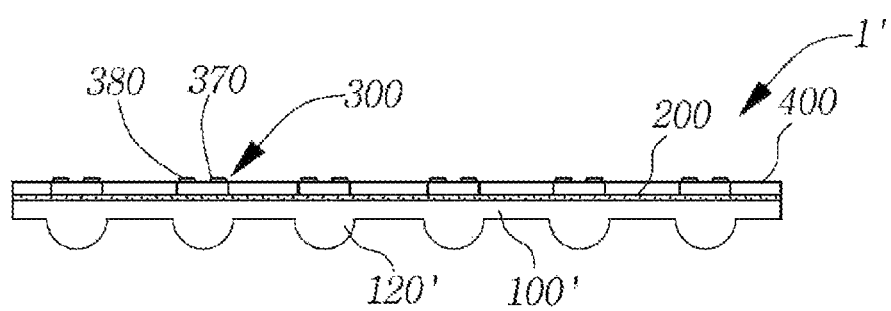
FIG. 6 is a diagram for explaining taking out a chip array sheet of a chip scale light-emitting diode package manufacturing method according to an embodiment of the present disclosure.
Figure 6:
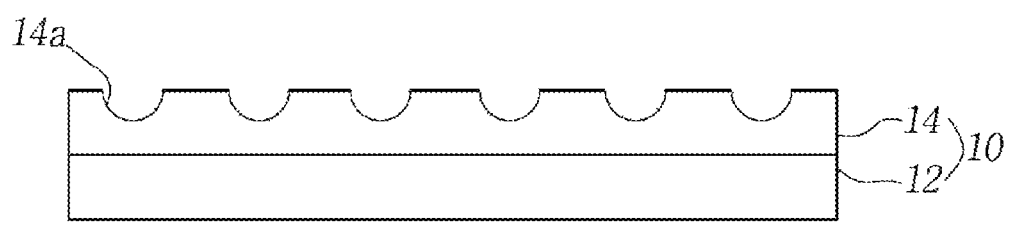

FIG. 6 is a diagram for explaining taking out a chip array sheet of a chip scale light-emitting diode package manufacturing method according to an embodiment of the present disclosure. The chip array sheet 1' having the lens layer 100' in contact with the lens molding sheet 10 is separated from the lens molding sheet 10. For this purpose, the imprinting material layer 14 of the lens molding sheet 10 in contact with the lens layer 100' is preferably formed of a material having good releasability, for example, a ultraviolet (UV) semi-hardening material, that may be easily separated from a material of the lens layer 100', preferably silicon resin.

Figure 7:
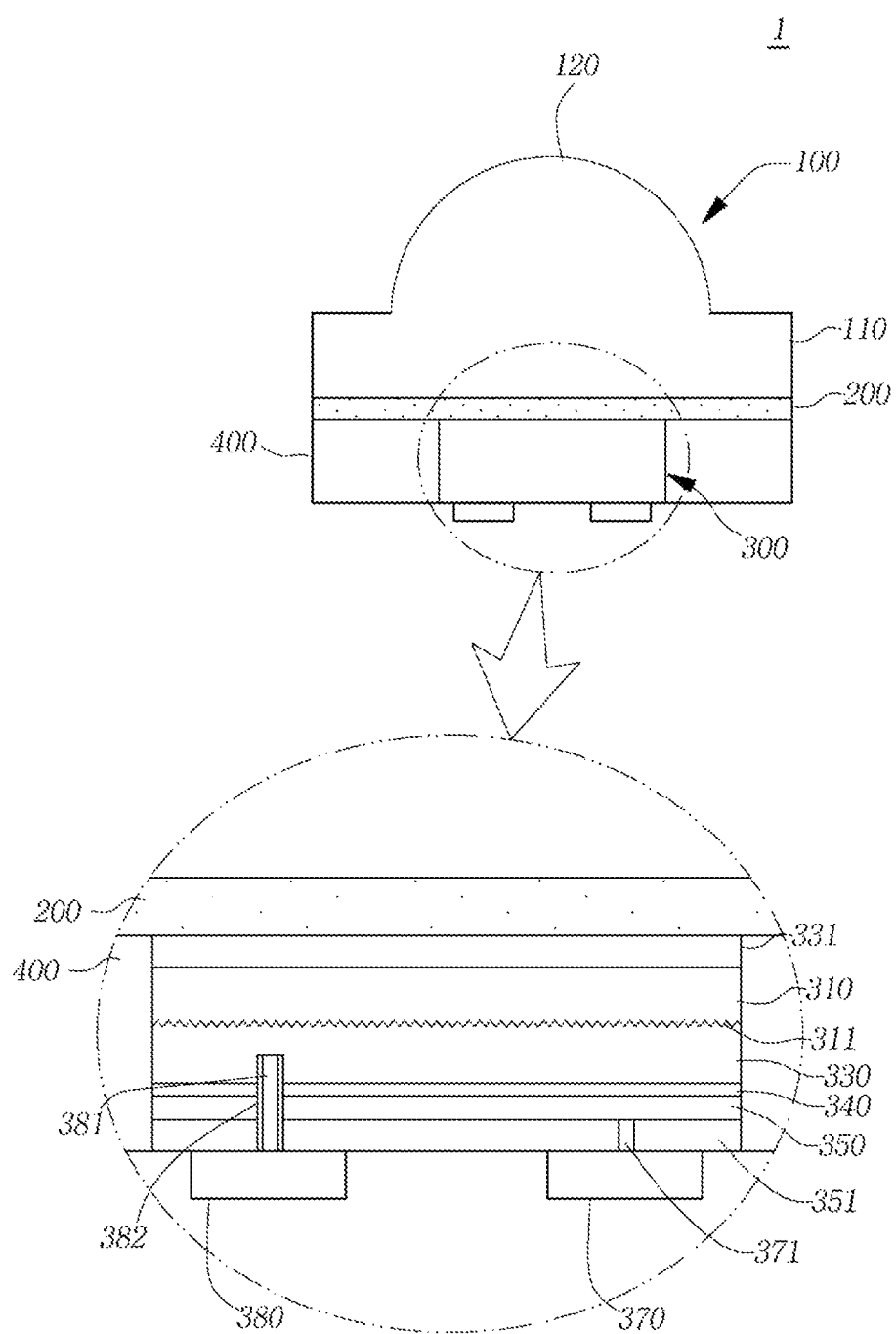
FIG. 7 is a view illustrating a chip scale light-emitting diode package obtained by cutting the chip array sheet illustrated in FIG. 6.

Next, a chip scale light-emitting diode package 1 as illustrated in FIG. 7 including one light-emitting diode chip 300 and one lens 100 is manufactured by cutting the chip array sheet 1' in chip units. The lens 100 is a portion formed by cutting the lens layer 100' to include only one lens portion 120'.

Compared to the conventional mold method, the method of forming the lens layer 100' including the plurality of lens portions using the dome-shaped intaglio 14a formed on the imprinting material layer 14 as described above, that is, an imprinting method minimizes the size of the lens portions provided in the lens layer 100', and facilitates aligning the centers of the light-emitting diode chip 300 and the lens 100 in the final manufactured chip scale light-emitting diode package. In the size of the chip scale package having a dome-shaped lens according to the present embodiment, the maximum height of the lens with respect to the bottom of the light-emitting diode chip is approximately 7 um to 800 um, equivalent to approximately 5 times to 10 times the thickness of the light-emitting diode chip, and the bottom area of the chip scale light-emitting diode package 1 is approximately 800 um. As the adhesive film for forming the above-described adhesive layer 200, an acrylic adhesive film may be used, but since an acrylic material is vulnerable to temperature, a semi-hardening silicone adhesive film may be used.

Referring to FIG. 7, the chip scale light-emitting diode package 1 according to the present embodiment includes the light-emitting diode chip 300, the molding part 400, the adhesive layer 200 and the lens 100, wherein the light-emitting diode chip 300 has the flip-chip structure, wherein the flip-chip structure has the first electrode pad 380 and the second electrode pad 370 on a lower surface that is a first surface, wherein the molding part 400 is formed to cover an outer surface of the light-emitting diode chip 300, wherein the molding part 400 includes an upper surface that is coplanar with an upper surface that is a second surface of the light-emitting diode chip 300, wherein the adhesive layer 200 is attached to cover the upper surface of the light-emitting diode chip 300 and the upper surface of the molding part 400, and wherein the lens 100 is attached to the adhesive layer 200 to cover the upper surface of the light-emitting diode chip 300 and the upper surface of the molding part 400. The lens 100 integrally includes a flat portion 110 attached to the adhesive layer 200 and a dome-shaped lens portion 120 formed above the flat portion 110 and having the central axis coincident with the central axis of the light-emitting diode chip 300.

In addition, the light-emitting diode chip 300 has reflective layers having the same or different reflectance on upper and lower portions thereof, and has a structure increasing an amount of light extracted laterally through the molding part 400 made of a light-transmitting material formed on the side thereof, and includes a semiconductor layer stacked structure, a first reflective layer 331 and a second reflective layer 351, wherein the semiconductor layer stacked structure includes an active layer 340 generating light through recombination of electrons and holes, a first semiconductor layer 330 provided above the active layer 340 and having a first conductivity, and a second semiconductor layer 350 provided under the active layer 340 and having a second conductivity different from the first conductivity, wherein the first reflective layer 331 is provided on the opposite side of the active layer 340 with respect to the first semiconductor layer 330 to reflect the light generated by the active layer 340, and wherein the second reflective layer 351 is provided on the opposite side of the active layer 340 with respect to the second semiconductor layer 350 to reflect the light generated by the active layer 340.

In the present embodiment, the first reflective layer 331 is provided in a top end of the light-emitting diode chip 300, and the second reflective layer 351 is provided in a bottom end of the light-emitting diode chip 300. In addition, the light-emitting diode chip 300 may further include a light-transmitting material layer 310 between the first semiconductor layer 330 and the first reflective layer 331, wherein the light-transmitting material layer 310 has a light scattering pattern 311 on a lower surface, and wherein the light scattering pattern 311 scatters light generated from the active layer 340 and directed upward. A light alignment characteristic may be controlled by adjusting a thickness of the light-transmitting material layer 310 and/or a size and shape of the light scattering pattern 311. In this case, the semiconductor layer stacked structure including the first semiconductor layer 330, the active layer 340, and the second semiconductor layer 350 may be a Group III-V nitride-based semiconductor layer, and the light-transmitting material layer 310 may be a sapphire substrate used for growth of the semiconductor layer stacked structure including the first semiconductor layer 330, the active layer 340, and the second semiconductor layer 350. Here, the light-transmitting material layer 310 made of the sapphire substrate may be removed by, for example, a process such as laser lift off (LLO) or other processes, and thus may be omitted.

As mentioned above, the light-emitting diode chip 300 has the first electrode pad 380 and the second electrode pad 370 at least one the bottom. In the present embodiment, the first electrode pad 380 and the second electrode pad 370 are formed to be spaced apart from each other on a lower surface of the second reflective layer 351. In this case, the first electrode pad 380 is connected to the first semiconductor layer 330 by a first via 381 surrounded by an insulating material 382 and extending from the first semiconductor layer 330 and penetrating the active layer 340, the second semiconductor layer 350 and the second reflective layer 351, and the second electrode pad 370 is connected to the second semiconductor layer 350 by a second via 371 extending from the second semiconductor layer 350 and penetrating the second reflective layer 351.

Each of the first reflective layer 331 and the second reflective layer 351 may be composed of a conductive material (e.g., a metal with high reflectance such as Ag or Al) or a non-conductive material (e.g., a light-transmitting dielectric material such as SiOX, TiOX, Ta2O5, MgF2). Preferably, the first reflective layer 331 and the second reflective layer 351 may include a distributed Bragg reflector (DBR) made of the non-conductive light-transmitting dielectric material. For example, when the first reflective layer 331 and the second reflective layer 351 may be distributed Bragg reflectors including SiO2/TiO2, they are formed by physical vapor deposition (PVD) such as electron beam evaporation. The thickness of each layer constituting the distributed Bragg reflector may be designed based on λActive/4n1 and λActive/4n2 (where λActive is the wavelength of the active layer 40 and n1 and n2 are the refractive indices of the distributed Bragg reflector materials).

The chip scale light-emitting diode package 1 according to the present embodiment uses a top and bottom double-sided reflective layer structure (for example, top and bottom double-sided distributed Bragg reflector structure) including the first reflective layer 331 and the second reflective layer 351 respectively constituting upper and lower surfaces of the light-emitting diode chip 300 and a structure in which the lens 100 is formed on the upper portion of the light-emitting diode chip 300, so that light is emitted through the light-transmitting molding part 400 and the lens 100 made of light-transmitting resin material, and when applied to backlight units, etc., it dramatically solves the problem of the formation of dark areas on the upper side.

Figure 8:
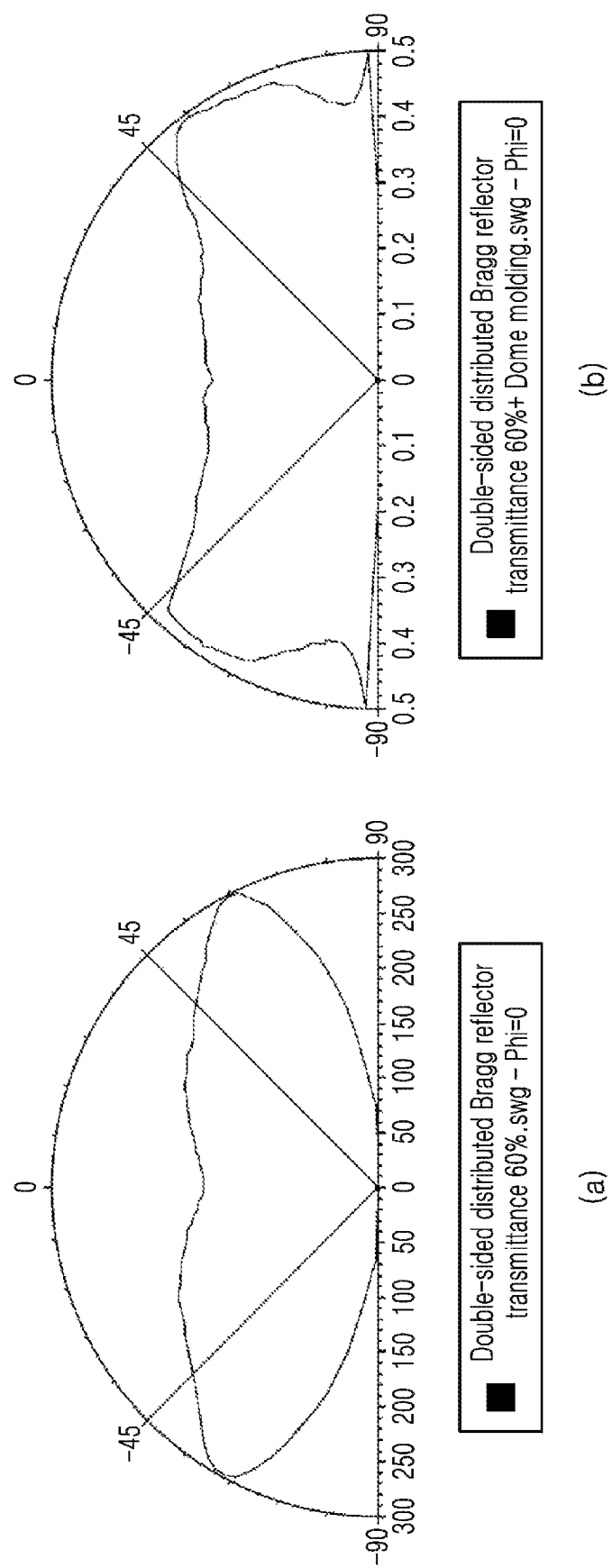
FIG. 8 is a view comparing light distribution ((a) of FIG. 8) of a chip scale light-emitting diode package including a light-emitting diode chip having 24 layers upper distributed Bragg reflector and a lens formed by the method illustrated in FIGS. 1 to 7 according to an embodiment of the present disclosure, and light distribution ((b) of FIG. 8) of a chip scale light-emitting diode package including 24 layers upper distributed Bragg reflector to which no lens is applied.

FIG. 8 illustrates a light distribution curve of the chip scale light-emitting diode package including the light-emitting diode chip having an upper distributed Bragg reflector and a lower distributed Bragg reflector and the lens on the upper surface of the light-emitting diode chip according to an embodiment of the present disclosure (refer to (a) of FIG. 8), and a light distribution curve of a chip scale light-emitting diode package including the structure of the light-emitting diode chip of the present embodiment but not including the lens (refer to (b) of FIG. 8). As illustrated in FIG. 8, it may be confirmed that the light distribution of the chip scale light-emitting diode package to which the upper distributed Bragg reflector and the lower distributed Bragg reflector and lens are directly applied is uniform.

Figure 9:
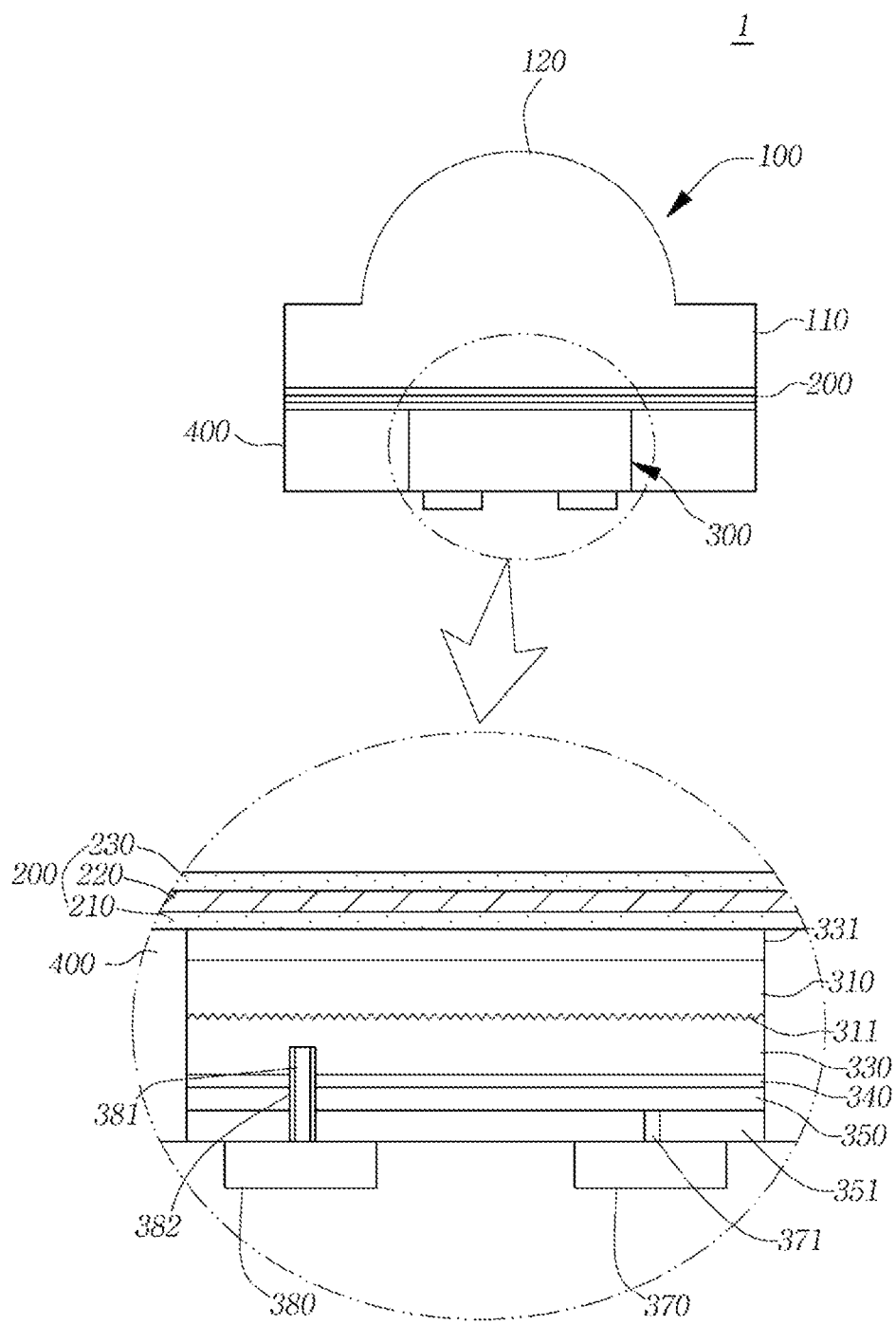
FIG. 9 is a view illustrating a chip scale light-emitting diode package according to another embodiment of the present disclosure.

FIG. 9 is a view illustrating a chip scale light-emitting diode package according to another embodiment of the present disclosure.

Referring to FIG. 9, like the chip scale light-emitting diode package of the previous embodiment, a chip scale light-emitting diode package 1 according to the present embodiment includes a light-emitting diode chip 300 of a flip-chip structure having a first electrode pad 380 and a second electrode pad 370 on a lower surface, a molding part 400 formed to cover an outer surface of the light-emitting diode chip 300 and including an upper surface that is flush with an upper surface of the light-emitting diode chip 300, an adhesive layer 200 attached to cover the upper surface of the light-emitting diode chip 300 and the upper surface of the molding part 400, and a lens 100 coupled to the adhesive layer 200 to cover the upper surface of the light-emitting diode chip 300 and the upper surface of the molding part 400. The lens 100 integrally includes a flat portion 110 attached to the adhesive layer 200 and a dome-shaped lens portion 120 formed on the flat portion 110 and having a central axis coincident with a central axis of the light-emitting diode chip 300.

The chip scale light-emitting diode package of the previous embodiment is a type of light-emitting diode that directly emits light without wavelength conversion (for example, a blue light-emitting diode), whereas the light-emitting diode of the present embodiment is a type of light-emitting diode that emits light by converting wavelength (for example, a white light-emitting diode). In order to apply a wavelength conversion material between the light-emitting diode chip 300 and the lens 100, the adhesive layer 200 in which a film-type wavelength conversion material 220 including, for example, a phosphor is disposed between the two adhesive films 210 and 230 is provided between the light-emitting diode chip 300 and the lens 100.

Figure 10:
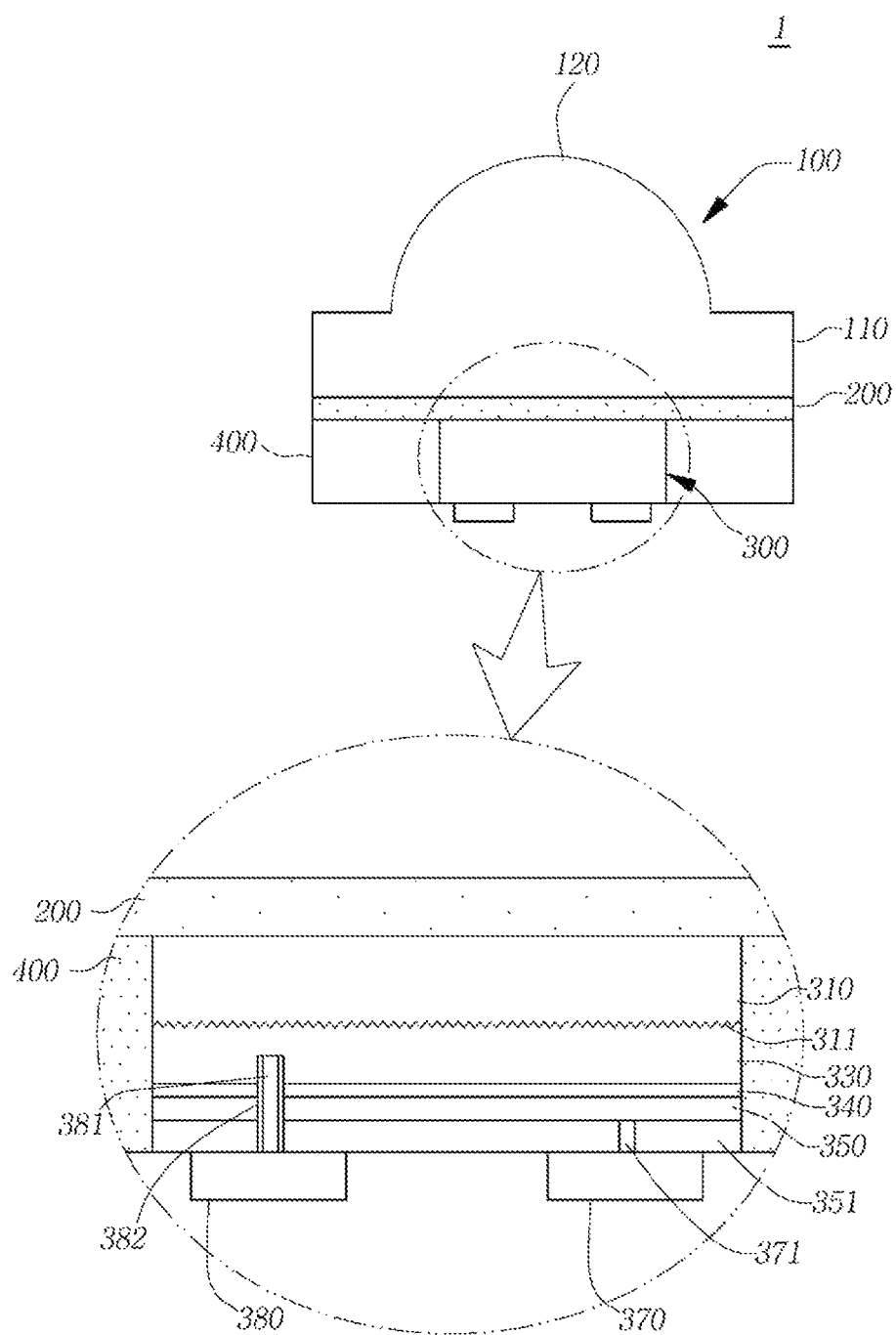
FIG. 10 is a view illustrating a chip scale light-emitting diode package according to another embodiment of the present disclosure.

FIG. 10 is a view illustrating a chip scale light-emitting diode package according to another embodiment of the present disclosure.

Referring to FIG. 10, a chip scale light-emitting diode package 1 of the present embodiment includes a molding part 400 having reflective properties of a white silicon material, and a light-emitting diode chip 300, unlike the previous embodiment, having a reflective layer only on the bottom without an upper reflective layer. That is, the light-emitting diode chip 300 is a top emission type. The light-emitting diode chip 300 of the present embodiment includes a semiconductor layer stacked structure, a lower reflective layer 351 and a light-transmitting material layer 310, wherein the semiconductor layer stacked structure has an active layer 340 generating light through recombination of electrons and holes, a first semiconductor layer 330 provided above the active layer 340 and having a first conductivity, and a second semiconductor layer 350 provided under the active layer 340 and having a second conductivity different from the first conductivity, wherein the lower reflective layer 351 is provided on the opposite side of the active layer 340 with respect to the second semiconductor layer 350, and reflects light generated by the active layer 340 upward, and wherein the light-transmitting material layer 310 is provided above the first semiconductor layer 330 and has a light scattering pattern 311 that is generated from the active layer 340 and scatters light directed upward. By controlling the thickness of the light-transmitting material layer 310 and/or the size and shape of the light scattering pattern 311, the light alignment characteristic may be adjusted. In this case, the semiconductor layer stacked structure including the first semiconductor layer 330, the active layer 340 and the second semiconductor layer 350 may be a Group III-V nitride-based semiconductor layer, and the light-transmitting material layer 310 may be a sapphire substrate used for growth of the semiconductor layer stacked structure including the first semiconductor layer 330, the active layer 340 and the second semiconductor layer 350. Here, the light-transmitting material layer 310 made of the sapphire substrate may be removed by, for example, a process such as laser lift off (LLO) or other processes, and thus may be omitted.

Figure 11:
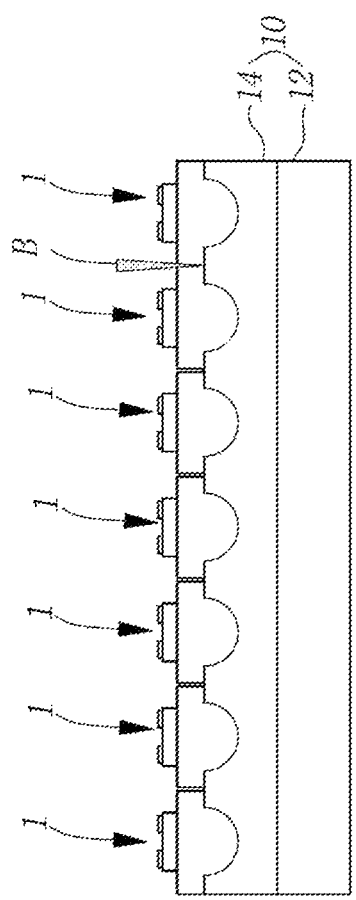
FIG. 11 is a view for explaining cutting a chip array sheet of a chip scale light-emitting diode package manufacturing method according to another embodiment of the present disclosure.

Now, a chip scale light-emitting diode package manufacturing method according to another embodiment of the present disclosure will be described with reference to FIGS. 11 to 12. The chip scale light-emitting diode package manufacturing method according to the present embodiment manufactures a chip array sheet in the same manner as shown in FIGS. 1 to 5. Merely, in the previous embodiment, as illustrated in FIG. 6, the chip scale light-emitting diode package is manufactured by separating the chip array sheet 1' from the lens molding sheet 10 and cutting the chip array sheet 1' individually. However, in the present embodiment, as illustrated in FIG. 11, in a state in which the chip array sheet is positioned on a lens molding sheet 10, using a laser beam B or the like, only the chip array sheet is cut into a plurality of chip scale light-emitting diode packages (1) without cutting the lens molding sheet 10.

Figure 12:
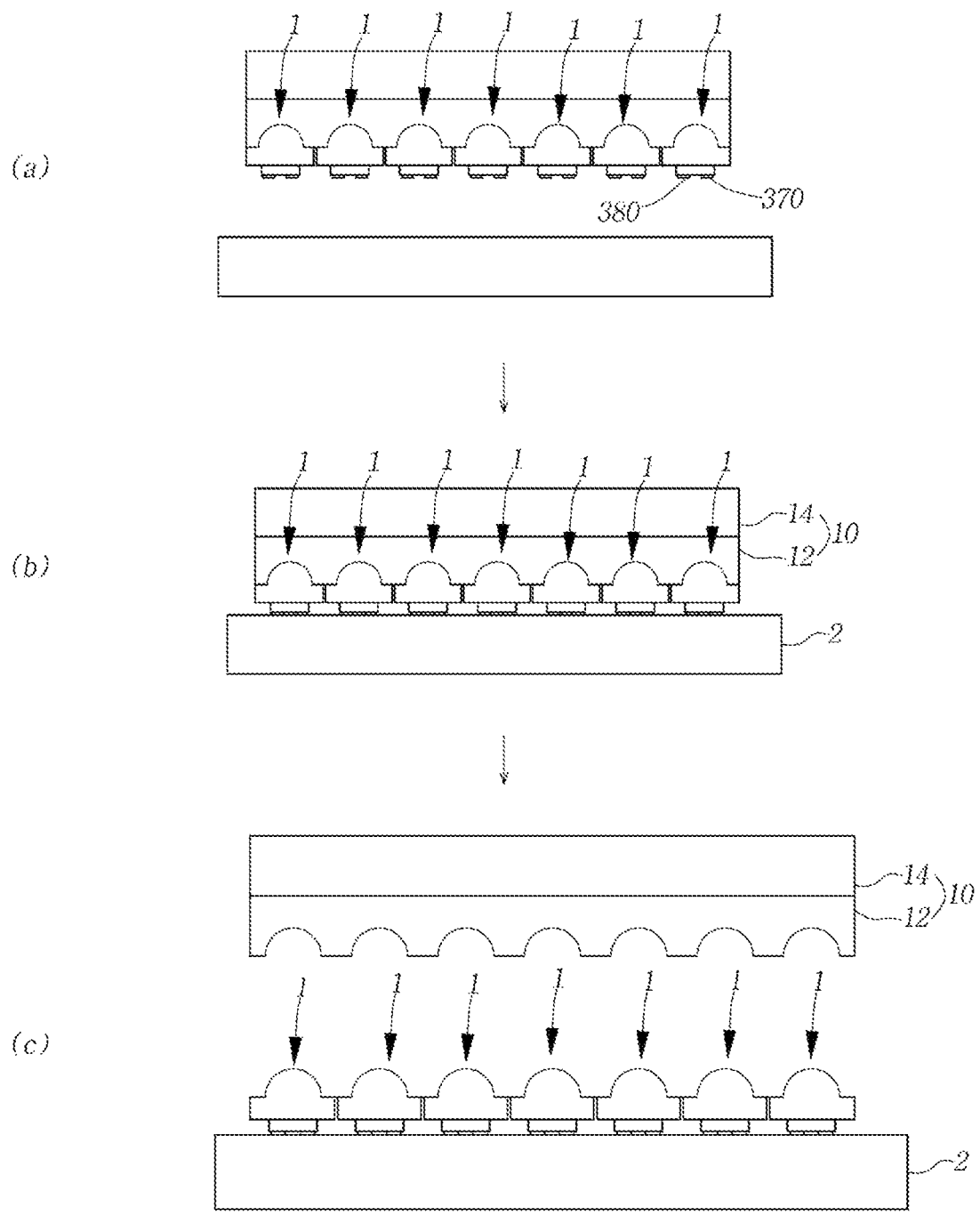
FIG. 12 is a view for explaining transferring the chip scale light-emitting diode package obtained by the cutting of FIG. 11.

Next, as illustrated in FIG. 12, after inverting the lens molding sheet 10 holding the plurality of chip scale light-emitting diode packages 1 by 180 degrees (refer to (a) of FIG. 12), the plurality of chip scale light-emitting diode packages 1 are attached/transferred to a support film 2 or a substrate in such a way that a first electrode pad 380 and a second electrode pad 370 of the chip scale light-emitting diode packages 1 face down (refer to (b) of FIG. 12). Next, the lens molding sheet 10 is separated from the chip scale light-emitting diode packages 1. In order to separate the lens molding sheet 10, it is considered to perform a treatment (e.g., ultraviolet irradiation) for weakening a bonding force between the lens molding sheet 10 and the chip scale light-emitting diode package 1.

Figure 13:
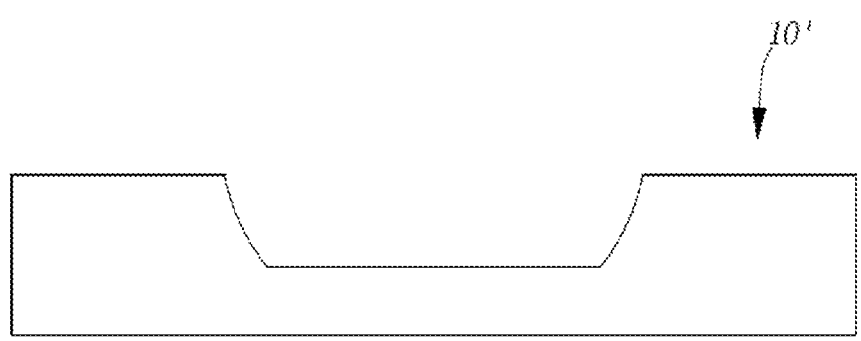
FIG. 13 is view exemplarily illustrating various other examples of a lens molding sheet.
Figure 13:
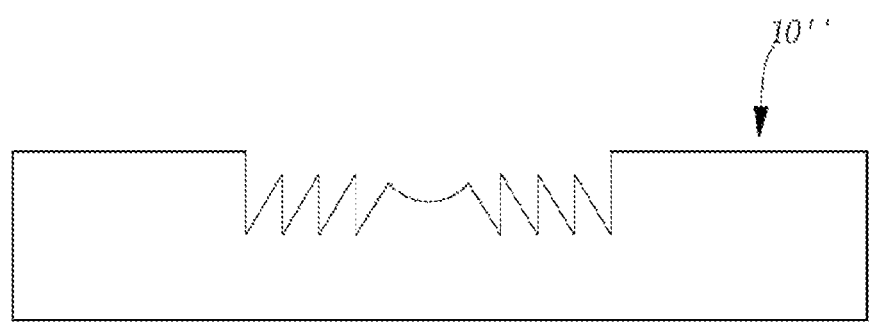

Although the lens molding sheet capable of molding dome-shaped lenses was introduced above, it is also possible to manufacture a chip scale light-emitting diode package including various lens shapes by using, for example, lens molding sheet 10' or 10" including intaglios of various shapes as illustrated in (a) and (b) of FIG. 13.

According to the present disclosure, a chip scale light-emitting diode package having a chip scale package structure in which electrode pads provided in a light-emitting diode chip are exposed to an outside and a lens of a precise shape matching a center of the light-emitting diode chip is implemented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method of manufacturing a chip scale light-emitting diode package, the method comprising:
   manufacturing a lens molding sheet having intaglios on one surface thereof;
   forming a lens layer having lens portions on one surface thereof and a flat surface on a surface opposite thereto by applying a light-transmitting resin to the intaglios;
   forming an adhesive layer on the flat surface of the lens layer;
   arranging, on the adhesive layer, light-emitting diode chips each having a first surface, on which a first electrode pad and a second electrode pad are formed, and a second surface opposite to the first surface, in such a way that the light-emitting diode chips correspond to the lens portions and the second surface is attached to the adhesive layer; and
   manufacturing a chip array sheet by forming a molding part on the adhesive layer to cover outer surfaces of the light-emitting diode chips,
   wherein the adhesive layer includes a first adhesive film attached to the lens layer and a second adhesive film attached to the light-emitting diode chips, and a wavelength conversion material is disposed between the first adhesive film and the second adhesive film.

2. The method of claim 1, wherein, in the manufacturing of the lens molding sheet, an imprinting material layer is formed on a base film, and the imprinting material layer is pressed by a mold having projections corresponding to the intaglios to form the intaglios.

3. The method of claim 1, wherein the adhesive layer comprises an adhesive film having a surface in contact with the flat surface of the lens layer and a surface in contact with the light-emitting diode chips, wherein each of the surfaces has adhesiveness.

4. The method of claim 1, further comprising separating the chip array sheet from the lens molding sheet, and cutting the chip array sheet separated from the lens molding sheet into a plurality of chip scale light-emitting diode packages.

5. The method of claim 1, further comprising forming a plurality of chip scale light-emitting diode packages by cutting only the chip array sheet while the chip array sheet is positioned on the lens molding sheet, and transferring the plurality of chip scale light-emitting diode packages onto a support film or substrate after the lens molding sheet holding the plurality of chip scale light-emitting diode packages is inverted by 180 degrees.

6. The method of claim 1, wherein, in manufacturing the chip array sheet, the first electrode pad and the second electrode pad of each of the light-emitting diode chips are exposed to the outside through the molding part.

7. The method of claim 1, wherein each of the light-emitting diode chips includes a first reflective layer and a second reflective layer respectively constituting top and bottom ends thereof.

8. The method of claim 7, wherein the molding part includes a light-transmitting material.

9. The method of claim 1, wherein the molding part includes a reflective material.

* * * * *